US012559831B2

(12) United States Patent
Lee et al.

(10) Patent No.: US 12,559,831 B2
(45) Date of Patent: Feb. 24, 2026

(54) MASK, MASK ASSEMBLY HAVING THE SAME, AND METHOD OF MANUFACTURING THE MASK

(71) Applicant: Samsung Display Co., Ltd., Yongin-si (KR)

(72) Inventors: Duckjung Lee, Hwaseong-si (KR); Sungsoon Im, Suwon-si (KR); Junho Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 530 days.

(21) Appl. No.: 17/889,885

(22) Filed: Aug. 17, 2022

(65) Prior Publication Data

US 2023/0118046 A1 Apr. 20, 2023

(30) Foreign Application Priority Data

Oct. 19, 2021 (KR) ........................ 10-2021-0139615

(51) Int. Cl.
*C23C 14/04* (2006.01)
*C23C 16/04* (2006.01)

(52) U.S. Cl.
CPC .......... *C23C 14/042* (2013.01); *C23C 16/042* (2013.01)

(58) Field of Classification Search
CPC ..... C23C 14/042; C23C 16/042; C23C 14/04; C23C 14/044; C23C 16/04; H10K 71/166; C30B 25/04
See application file for complete search history.

(56) References Cited

U.S. PATENT DOCUMENTS

| | | | | |
|---|---|---|---|---|
| 6,589,382 B2* | 7/2003 | Clark | ................... | H10K 71/191 |
| | | | | 118/721 |
| 6,866,720 B2* | 3/2005 | Kim | ...................... | C23C 14/042 |
| | | | | 118/301 |
| 8,778,115 B2* | 7/2014 | Lee | ...................... | H10K 71/166 |
| | | | | 156/229 |
| 2011/0185966 A1* | 8/2011 | Lee | ...................... | C23C 14/042 |
| | | | | 118/504 |
| 2012/0145076 A1* | 6/2012 | Shin | ...................... | C23C 14/042 |
| | | | | 156/60 |
| 2012/0279444 A1* | 11/2012 | Hong | ................... | C23C 14/042 |
| | | | | 118/504 |
| 2016/0079568 A1* | 3/2016 | Han | ....................... | C23C 18/31 |
| | | | | 438/34 |

(Continued)

FOREIGN PATENT DOCUMENTS

| | | |
|---|---|---|
| JP | 2010-90415 | 4/2010 |
| KR | 20120066493 A | 6/2012 |

(Continued)

*Primary Examiner* — Aiden Lee
(74) *Attorney, Agent, or Firm* — Lerner David LLP

(57) ABSTRACT

A mask includes a first sub-mask, a second sub-mask facing the first sub-mask in a first direction and including a boundary surface contacting a boundary surface of the first sub-mask at a boundary portion, and a coupling bar disposed on a lower surface of the first sub-mask and a lower surface of the second sub-mask to connect the first sub-mask to the second sub-mask. Each of the first sub-mask, the second sub-mask, and the coupling bar includes openings. The openings of the coupling bar are aligned with part of the openings of the first and second sub-masks in a thickness direction of the coupling bar.

14 Claims, 17 Drawing Sheets

(56) References Cited

U.S. PATENT DOCUMENTS

| | | | | |
|---|---|---|---|---|
| 2017/0198383 A1* | 7/2017 | Chang | .................. | C23C 14/042 |
| 2019/0144987 A1* | 5/2019 | Guo | ...................... | H10K 71/00 |
| | | | | 118/504 |
| 2019/0368025 A1* | 12/2019 | Kim | ...................... | C23C 14/042 |
| 2023/0240124 A1* | 7/2023 | Kim | .................... | H10K 71/164 |
| 2024/0229220 A9* | 7/2024 | Lee | ...................... | C23C 16/042 |

FOREIGN PATENT DOCUMENTS

| | | |
|---|---|---|
| KR | 10-1424249 | 8/2014 |
| KR | 20160033338 A | 3/2016 |
| KR | 10-2018-0053143 | 5/2018 |
| KR | 10-1867467 | 6/2018 |
| KR | 10-2036003 | 10/2019 |
| KR | 20190138256 A | 12/2019 |

* cited by examiner

MSA

MASK, MASK ASSEMBLY HAVING THE SAME, AND METHOD OF MANUFACTURING THE MASK

CROSS REFERENCE TO RELATED APPLICATION(S)

This U.S. non-provisional patent application claims priority under 35 U.S.C. § 119 of Korean Patent Application No. 10-2021-0139615, filed on Oct. 19, 2021 in the Korean Intellectual Property Office (KIPO), the contents of which are hereby incorporated by reference in its entirety.

BACKGROUND

1. Technical Field

The disclosure relates to a mask, a mask assembly including the same, and a method of manufacturing the mask. More particularly, the disclosure relates to a mask including plural masks coupled to each other, a mask assembly including the mask, and a method of manufacturing the mask.

2. Description of the Related Art

A display panel includes pixels. Each of the pixels includes a driving device, such as a transistor, and a display device, such as an organic light emitting diode. The display device is formed by stacking an electrode and a light emission pattern on a substrate.

The light emission pattern is patterned using a mask through which holes are defined, and thus, the light emission pattern is formed in predetermined areas. The light emission pattern of the display device is formed to correspond to the holes of the mask. Studies on the shape and the number of the holes of the mask are in progress to improve a manufacturing efficiency of the display device.

SUMMARY

The disclosure provides a mask having an increased size by coupling (or connecting) masks.

The disclosure provides a mask assembly including the mask.

The disclosure provides a method of manufacturing the mask.

Embodiments of the disclosure provide a mask including a first sub-mask, a second sub-mask facing the first sub-mask in a first direction and including a boundary surface contacting a boundary surface of the first sub-mask at a boundary portion, and a coupling bar disposed on a lower surface of the first sub-mask and a lower surface of the second sub-mask to connect the first sub-mask to the second sub-mask. Each of the first sub-mask, the second sub-mask, and the coupling bar includes openings, and the openings of the coupling bar are aligned with part of the openings of the first and second sub-masks in a thickness direction of the coupling bar.

Each of the first sub-mask and the second sub-mask may include a first portion; and a second portion that extends from the first portions, the first portion of the first sub-mask and the first portion of the second sub-mast may be adjacent to each other, the second portion of the first sub-mask and the second portion of the second sub-mask may not be adjacent to each other, and the boundary portion may be disposed between the first portion of the first sub-mask and the first portion of the second sub-mask.

The first portion of the first sub-mask and the first portion of the second sub-mask may be defined as a connection portion, and the coupling bar may overlap the connection portion in a plan view.

The openings may include a first opening formed through the first portion; a second opening formed through the second portion; and a third opening formed through the coupling bar, and the third opening may be aligned with the first opening in the thickness direction of the coupling bar.

The third opening may have a width greater than a width of the first opening.

Each of the first opening and the third opening may have a tapered shape in a cross-section, and a difference angle between a taper angle of the first opening and a taper angle of the third opening may be equal to or greater than about 1 degree and equal to or smaller than about 10 degrees.

The mask may further include se connection rods that connect the first and second sub-masks to the coupling bar.

The connection rods may include a first connection rod and a second connection rod which are disposed between the openings in the connection portion, and the first connection rod may penetrate through the boundary portion.

The first connection rod may have a diameter different from a diameter of the second connection rod.

A diameter of the first connection rod may be greater than a diameter of the second connection rod and may be smaller than a distance between the openings adjacent to each other.

A first distance between the openings disposed in the first portion and adjacent to each other with the boundary portion disposed between the openings in the first direction may be substantially equal to a second distance between the openings disposed in the second portion and adjacent to each other in the first direction.

Each of the first sub-mask and the second sub-mask may further include pads disposed on side surfaces except the boundary surface.

The boundary portion may extend in a second direction intersecting the first direction and have a straight line shape or a zigzag shape in a plan view.

The boundary surface may have an oblique shape or a step difference.

Embodiments of the disclosure provide a mask assembly including a first frame, a second frame disposed on the first frame and including cell openings, and masks respectively disposed on the cell openings. Each of the masks includes a first sub-mask, a second sub-mask including a boundary surface contacting a boundary surface of the first sub-mask at a boundary portion, and a coupling bar disposed on a lower surface of the first sub-mask and a lower surface of the second sub-mask to connect the first sub-mask to the second sub-mask. Each of the first sub-mask, the second sub-mask, and the coupling bar includes openings, and the openings of the coupling bar are aligned with part of the openings of the first and second sub-masks in a thickness direction of the coupling bar.

Embodiments of the disclosure provide a method of manufacturing a mask. The method includes aligning a first sub-mask and a second sub-mask, the first sub-mask including a first opening that is adjacent to a boundary portion and a second opening that is not adjacent to the boundary portion, the second sub-mask including a first opening that is adjacent to the boundary portion and a second opening that is not adjacent to the boundary portion, the first and second sub-masks being disposed to be symmetrical to each other with respect to the boundary portion, and a boundary surface of the first sub-mask contacting a boundary surface of the second sub-mask at the boundary portion, connecting a coupling bar disposed on a lower surface of the first sub-mask and a lower surface of the second sub-mask and overlapping the boundary portion to the first sub-mask and the second sub-mask in a plan view, and processing a third opening formed in the coupling bar and aligned with the first opening in a thickness direction of the coupling bar.

The connecting of the first and second sub-masks may include welding the first and second sub-masks to the coupling bar to form connection rods.

The forming of the connection rods may include forming first connection rods penetrating through the boundary portion and second connection rods disposed adjacent to the boundary portion.

The processing of the third opening may include irradiating a laser onto a lower surface opposite to a contact surface of the coupling bar contacting the first and second sub-masks.

The third opening may have a taper angle smaller than a taper angle of each of the first and second openings by at least about 1 degree.

According to the above, the masks are coupled each other, and thus, the mask with a large size is manufactured.

In addition, as the mask having the large size is manufactured through the manufacturing method, a display device with a large size is effectively manufactured.

BRIEF DESCRIPTION OF THE DRAWINGS

The above and other advantages of the disclosure will become readily apparent by reference to the following detailed description when considered in conjunction with the accompanying drawings wherein:

FIG. 1B is a schematical exploded perspective view of a mask assembly according to an embodiment of the disclosure;

FIGS. 2A and 2B are schematical plan views of a mask according to an embodiment of the disclosure;

FIGS. 5A to 5F are schematical views of a method of manufacturing a mask according to an embodiment of the disclosure;

FIGS. 7A and 7B are schematical enlarged plan views of a mask according to embodiments of the disclosure.

DETAILED DESCRIPTION OF THE EMBODIMENTS

Figure 1A:
FIG. 1A is a schematical plan view of a mask assembly according to an embodiment of the disclosure.
Figure 1A:
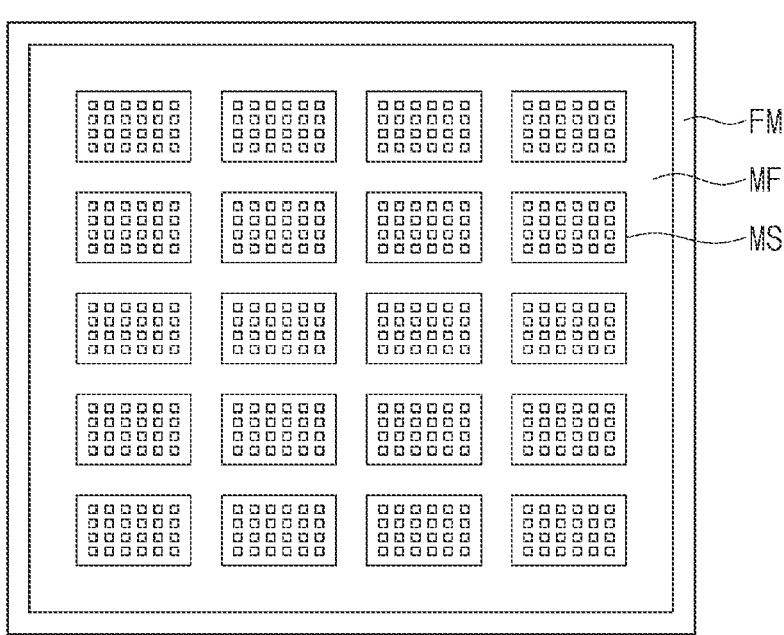
Figure 1A:
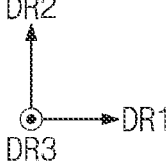

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components may be exaggerated for effective description of the technical content. As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms (or meanings) as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to accompanying drawings.

Figure 1B:
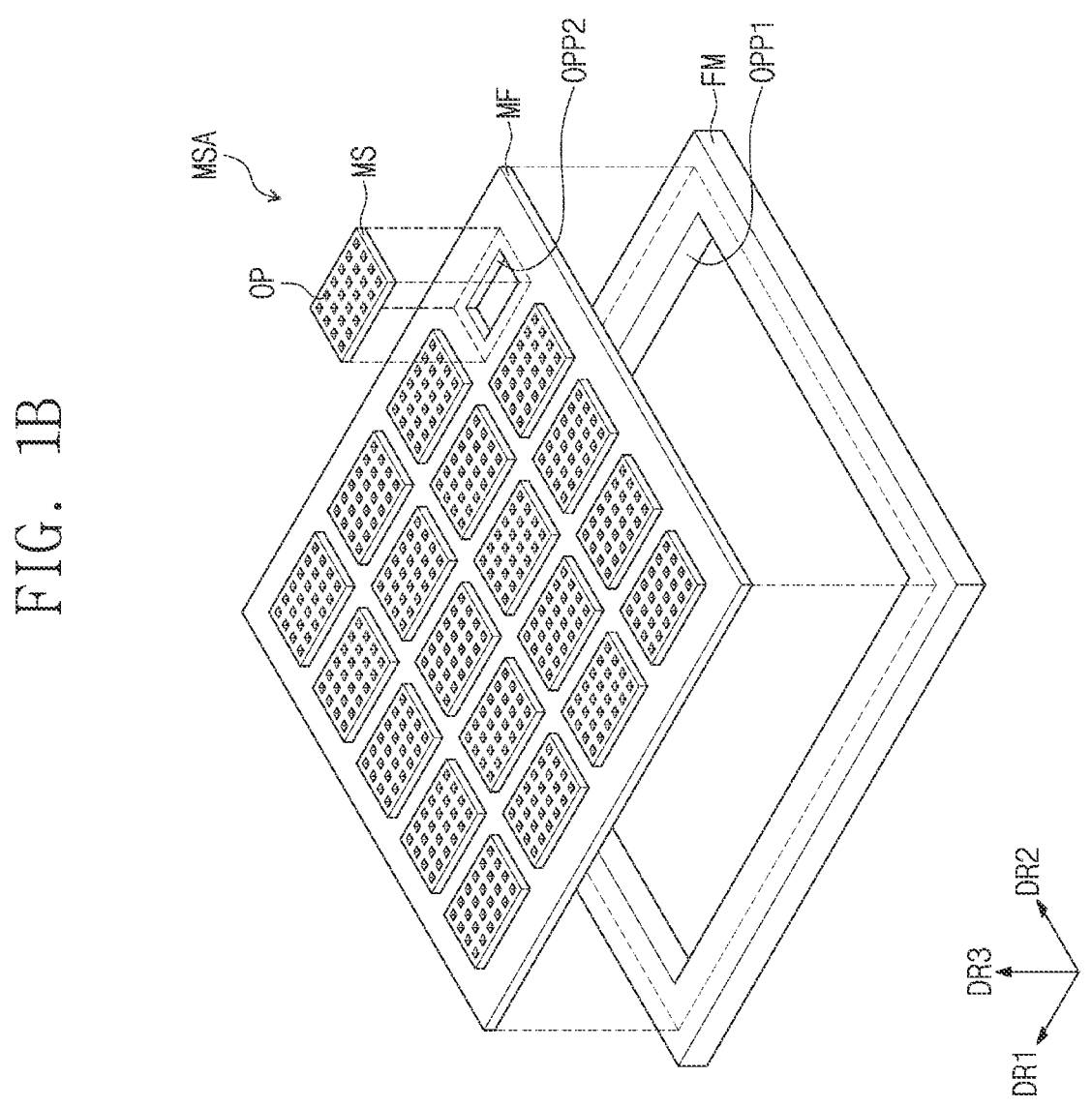

FIG. 1A is a schematic plan view of a mask assembly MSA according to an embodiment of the disclosure. FIG. 1B is a schematic exploded perspective view of the mask assembly MSA according to an embodiment of the disclosure.

The mask assembly MSA may be used to manufacture a display device. In detail, the mask assembly MSA may be used to deposit an organic light emitting element layer on a deposition substrate of the display device.

Referring to FIGS. 1A and 1B, the mask assembly MSA may include a first frame FM, a second frame MF, and masks MS. The first frame FM may be referred to as a mask frame FM, and the second frame MF may be referred to as an intermediate frame MF. The mask frame FM may have a quadrangular shape defined by sides extending in a first direction DR1 and sides extending in a second direction DR2. The second direction DR2 may intersect the first direction DR1. However, the shape of the mask frame FM should not be limited thereto or thereby and may have a variety of shapes.

Hereinafter, a direction substantially perpendicular to a plane defined by the first direction DR1 and the second direction DR2 may be referred to as a third direction DR3. In the disclosure, the expression "when viewed in a plane" or "in a plan view" may mean a state of being viewed in the third direction DR3.

The mask frame FM may have a quadrangular ring shape in a plan view. In detail, a frame opening OPP1 may be defined in the mask frame FM. The frame opening OPP1 may overlap at least a portion of each of the masks MS.

The mask frame FM may include a metal material. As an example, the mask frame FM may include Invar with a relatively small thermal expansion coefficient. The mask frame FM may include, for example, nickel (Ni), a nickel-cobalt alloy, a nickel-iron alloy, or the like. The mask frame FM may have a sufficient rigidity since the mask frame FM includes the metal material.

The intermediate frame MF may be disposed on the mask frame FM. The intermediate frame MF may be provided with cell openings OPP2. The cell openings OPP2 may respectively correspond to the masks MS. The intermediate frame MF may have a thickness smaller than that of the mask frame FM. As the cell openings OPP2 are formed in the intermediate frame MF with relatively easy machinability, a shape of the mask frame FM having a relatively large thickness may be simplified.

Openings OP may be defined in each of the masks MS. The organic light emitting element layer may be deposited on the deposition substrate of the display device through the openings OP. Each of the openings OP may have a quadrangular shape, but the disclosure should not be limited thereto or thereby. According to an embodiment, each of the openings OP may have a variety of shapes such as a circular shape or a lozenge shape. The masks MS may include a metal material. As an example, the masks MS may include Invar having a relatively small thermal expansion coefficient.

Figure 2A:
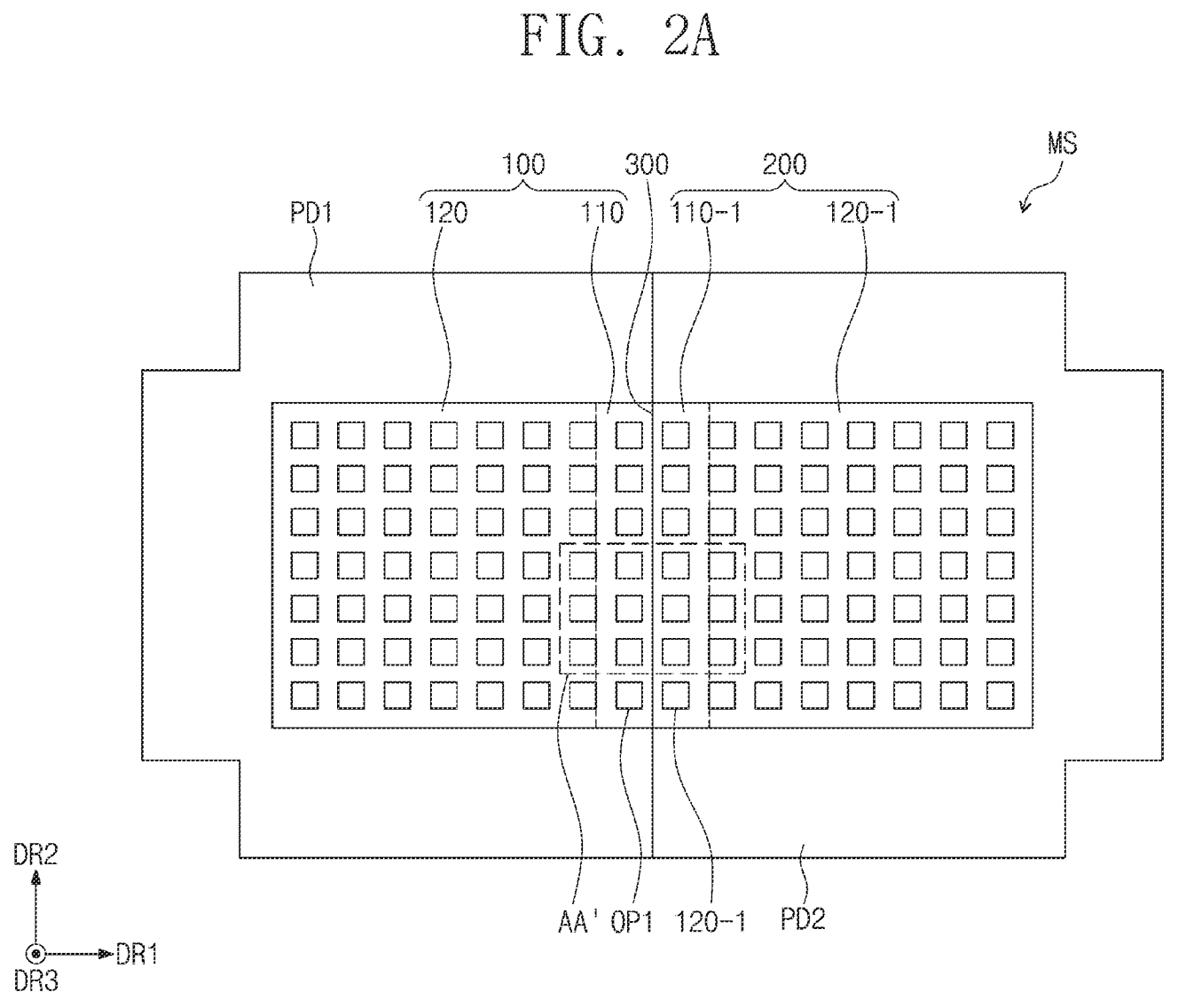
Figure 2B:
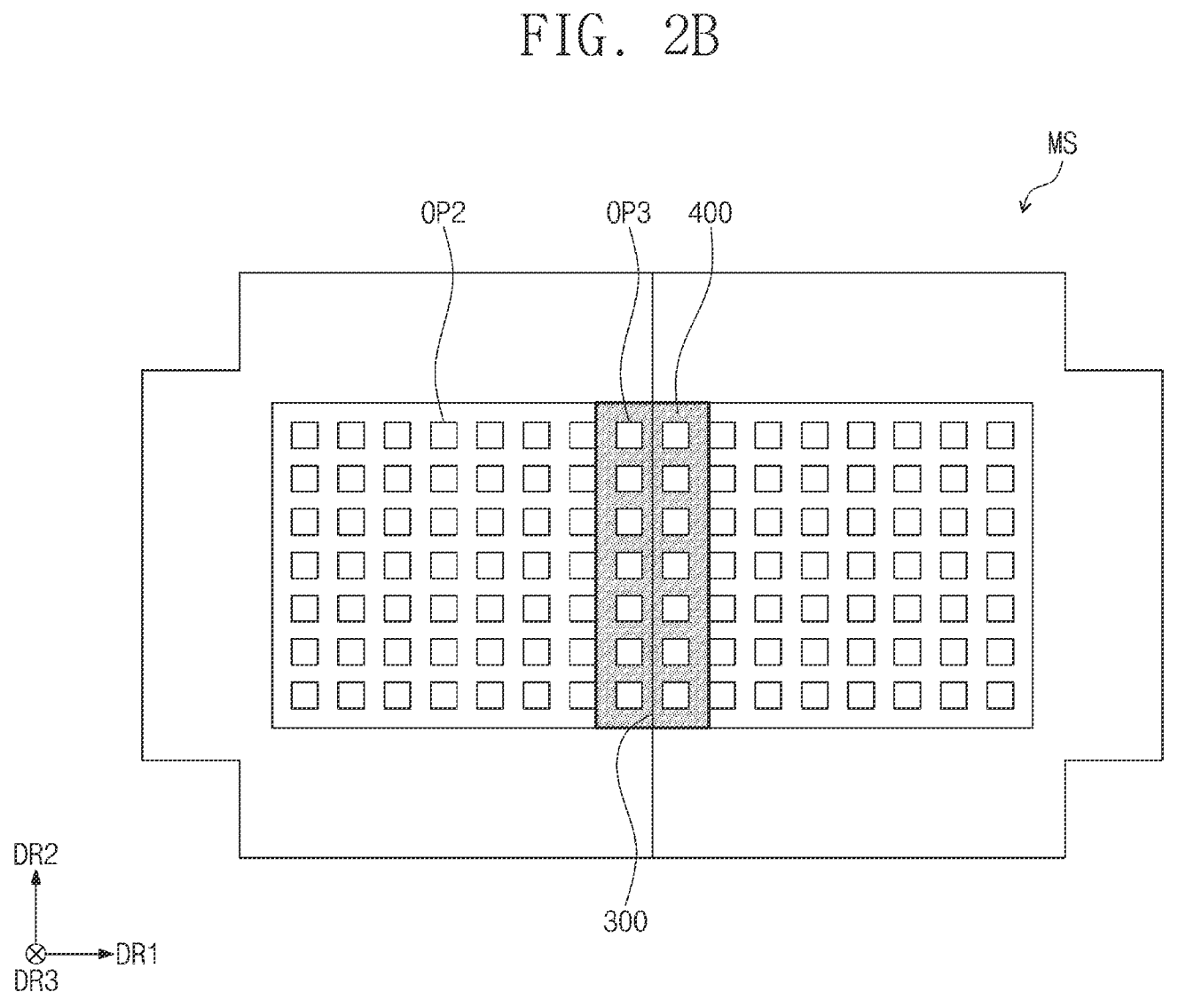

FIGS. 2A and 2B are schematic plan views of a mask MS according to an embodiment of the disclosure.

FIG. 2A illustrates an upper surface or a front surface of the mask MS. FIG. 2B illustrates a lower surface or a rear surface of the mask MS. The lower surface of the mask MS may face toward the intermediate frame MF in FIGS. 1A and 1B. The lower surface of the mask MS may correspond to a deposition surface on which the organic light emitting element layer is deposited in a deposition process.

Referring to FIGS. 2A and 2B, the mask MS may include a first sub-mask 100, a second sub-mask 200, and a coupling bar 400.

The mask MS may be formed by coupling the first sub-mask 100 to the second sub-mask 200. The mask MS may be obtained by the first sub-mask 100 and the second sub-mask 200 aligned with the first sub-mask 100 and coupled to the first sub-mask 100 at a boundary portion 300. In detail, a boundary surface of the first sub-mask 100 and a boundary surface of the second sub-mask 200 may contact or (may be in contact with) each other in the first direction DR1.

Each of the first sub-mask 100 and the second sub-mask 200 may form a half of the mask MS. The first sub-mask 100 and the second sub-mask 200 may be symmetrical to each other with respect to the boundary portion 300. The boundary portion 300 may include the boundary surface of the first sub-mask 100 and the boundary surface of the second sub-mask 200 that contact the boundary surface of the first sub-mask 100. In FIGS. 2A and 2B, the boundary portion 300 may include a straight line extending in the second direction DR2. The shape of the boundary portion 300 should not be particularly limited.

The first sub-mask 100 and the second sub-mask 200 may be provided with the openings OP (refer to FIG. 1B). The first sub-mask 100 and the second sub-mask 200 may include first portions 110 and 110-1, respectively, that are adjacent to the boundary portion 300 and second portions 120 and 120-1, respectively, that are not adjacent to the boundary portion 300. The first sub-mask 100 may include the first portion 110 that is adjacent to the boundary portion 300 and the second portion 120 that is not adjacent to the boundary portion 300, and the second sub-mask 200 may include the first portion 110-1 that is adjacent to the boundary portion 300 and the second portion 120-1 that is not adjacent to the boundary portion 300. The boundary portion 300 may be defined between the first portion 110 of the first sub-mask 100 and the first portion 110-1 of the second sub-mask 200.

First openings OP1 may be defined in the first portions 110 and 110-1. Second openings OP2 may be defined in the second portions 120 and 120-1. The first sub-mask 100 may include the first openings OP1 defined in the first portion 110 and the second openings OP2 defined in the second portion 120, and the second sub-mask 200 may include the first openings OP1 defined in the first portion 110-1 and the second openings OP2 defined in the second portion 120-1.

The first sub-mask 100 may include pads PD1, and the second sub-mask 200 may include pads PD2. The pads PD1 and PD2 may be attached to side surfaces of the first sub-mask 100 and the second sub-mask 200. In FIGS. 2A and 2B, each of the first sub-mask 100 and the second sub-mask 200 may include four side surfaces. Among the four side surfaces, a side surface may correspond to the boundary surface. The pads PD1 and PD2 may be disposed at three side surfaces except the boundary surface of the four side surfaces of each of the first sub-mask 100 and the second sub-mask 200. The pads PD1 and PD2 may correspond to portions that are gripped to tension four sides of each of the first sub-mask 100 and the second sub-mask 200. The pads PD1 and PD2 may be respectively removed from the first sub-mask 100 and the second sub-mask 200 in the manufacturing process of the mask assembly MSA (refer to FIG. 1A).

The coupling bar 400 may couple the first sub-mask 100 to the second sub-mask 200. The coupling bar 400 may be disposed on the lower surfaces of the first sub-mask 100 and the second sub-mask 200. The coupling bar 400 may overlap the boundary portion 300. The coupling bar 400 may have a bar shape extending in the second direction DR2 to overlap the boundary portion 300.

The coupling bar 400 may be disposed on the first portions 110 and 110-1. The coupling bar 400 may be disposed on the lower surfaces of the first portions 110 and 110-1.

The coupling bar 400 may be provided with third openings OP3. The third openings OP3 may be aligned with the first openings OP1 in the third direction DR3. The third direction DR3 may correspond to a thickness direction of the coupling bar 400. The coupling bar 400 may include a metal material. As an example, the coupling bar 400 may include Invar having a relatively small thermal expansion coefficient. For example, the coupling bar 400 and the mask MS may include a same material. The coupling bar 400 may have a thickness from about 3 μm to about 25 μm. The thickness of the coupling bar 400 may be smaller than a thickness of the mask MS.

Figure 3:
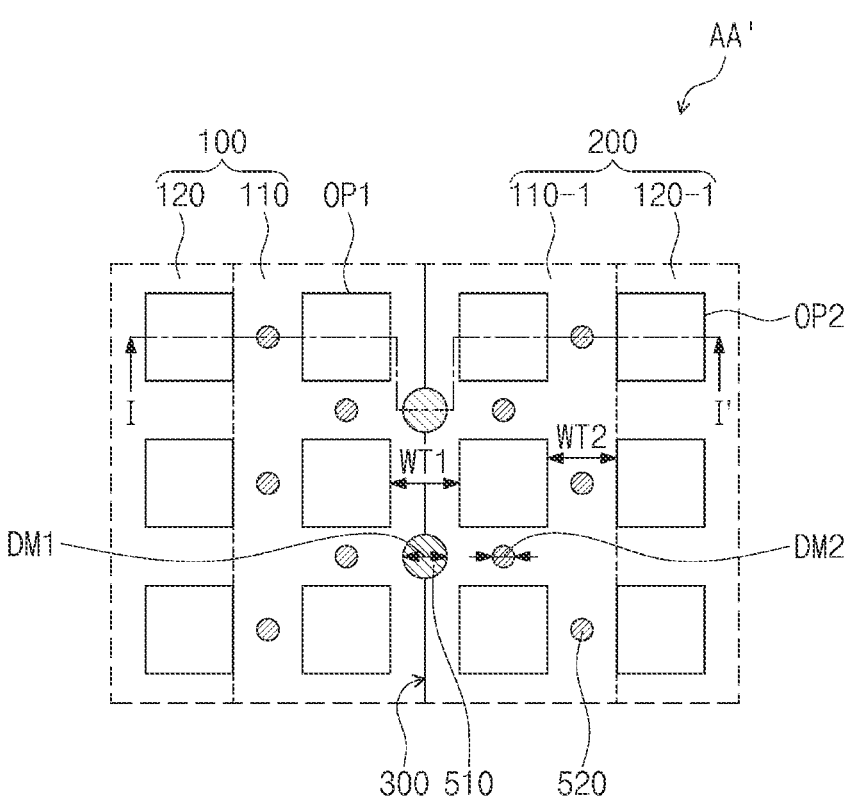
FIG. 3 is a schematical enlarged plan view of an area AA' of FIG. 2A according to an embodiment of the disclosure.
Figure 4:
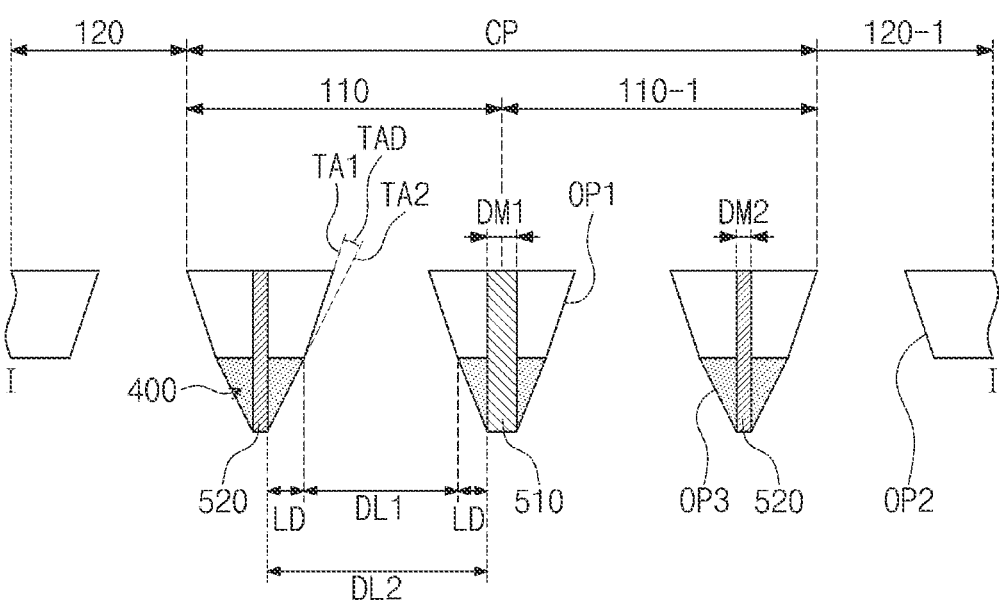
FIG. 4 is a schematical cross-sectional view taken along line I-I' of FIG. 3.
Figure 4:
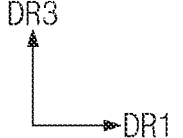

FIG. 3 is a schematic enlarged plan view of area AA' of FIG. 2A according to an embodiment of the disclosure. FIG. 4 is a schematic cross-sectional view taken along line I-I' of FIG. 3.

Referring to FIGS. 3 and 4, a connection portion CP may be defined on the mask MS. The connection portion CP may include the first portion 110 of the first sub-mask 100 and the first portion 110-1 of the second sub-mask 200. Accordingly, the coupling bar 400 may overlap the connection portion CP. The first openings OP1 may be defined in the connection portion CP.

The mask MS may include connection rods 510 and 520 that connect the first sub-mask 100 and the second sub-mask 200 to the coupling bar 400. The connection rods 510 and 520 may be welded to couple the first sub-mask 100 and the second sub-mask 200 to the coupling bar 400. The connection rods 510 and 520 may penetrate through the first sub-mask 100, the second sub-mask 200, and the coupling bar 400 in the third direction DR3. The connection rods 510 and 520 may penetrate through the coupling bar 400 after penetrating through the first sub-mask 100 and the second sub-mask 200 to couple the first sub-mask 100 and the second sub-mask 200 to the coupling bar 400.

The connection rods 510 and 520 may be disposed on the connection portion CP. The connection rods 510 and 520 may be disposed between the first openings OP1 and between the third openings OP3. As shown in FIG. 3, each of the connection rods 510 and 520 may have a circular shape in a plan view, but the disclosure is not limited thereto, and the connection rods 510 and 520 may have a variety of shapes according to a welding operation.

The connection rods 510 and 520 may include first connection rods 510 and second connection rods 520. The first connection rods 510 may penetrate through the boundary portion 300. The second connection rods 520 may be disposed between the first openings OP1 in the connection portion CP except the boundary portion 300. The position and the number of the second connection rods 520 should not be particularly limited.

Each of the first connection rods 510 may have a diameter DM1 different from a diameter DM2 of each of the second connection rods 520. As an example, the diameter DM1 of each of the first connection rods 510 may be greater than the diameter DM2 of each of the second connection rods 520. The diameter DM1 of the first connection rods 510 may be smaller than a distance WT1 between the first openings OP1. As an example, the diameter DM1 of each of the first connection rods 510 may be within a range from about 100 μm to about 600 μm, and preferably may be equal to or greater than about 200 μm. The diameter DM2 of each of the second connection rods 520 may be within a range from about 20 μm to about 200 μm, and preferably may be equal to or smaller than about 100 μm.

Figure 5A:
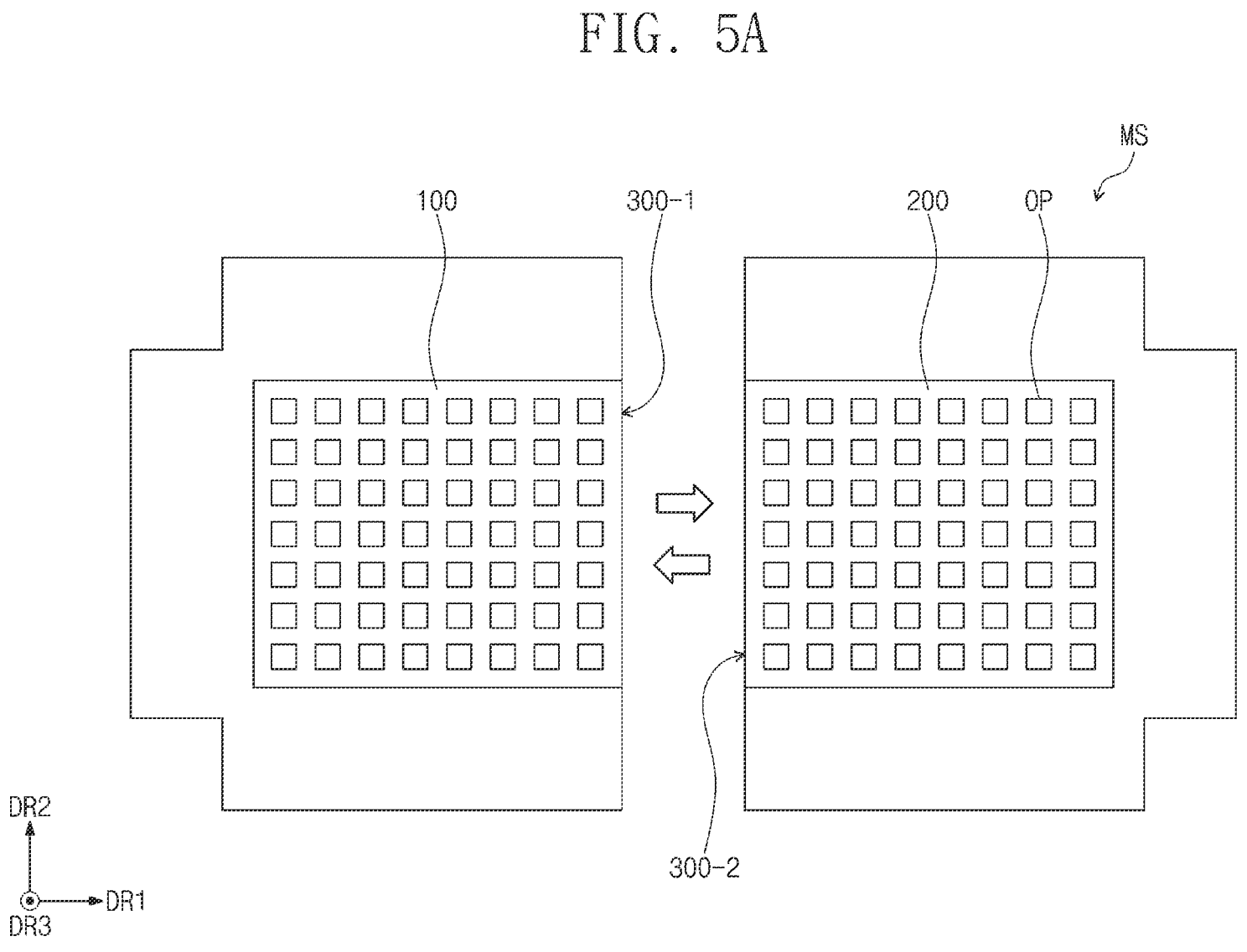
Figure 5B:
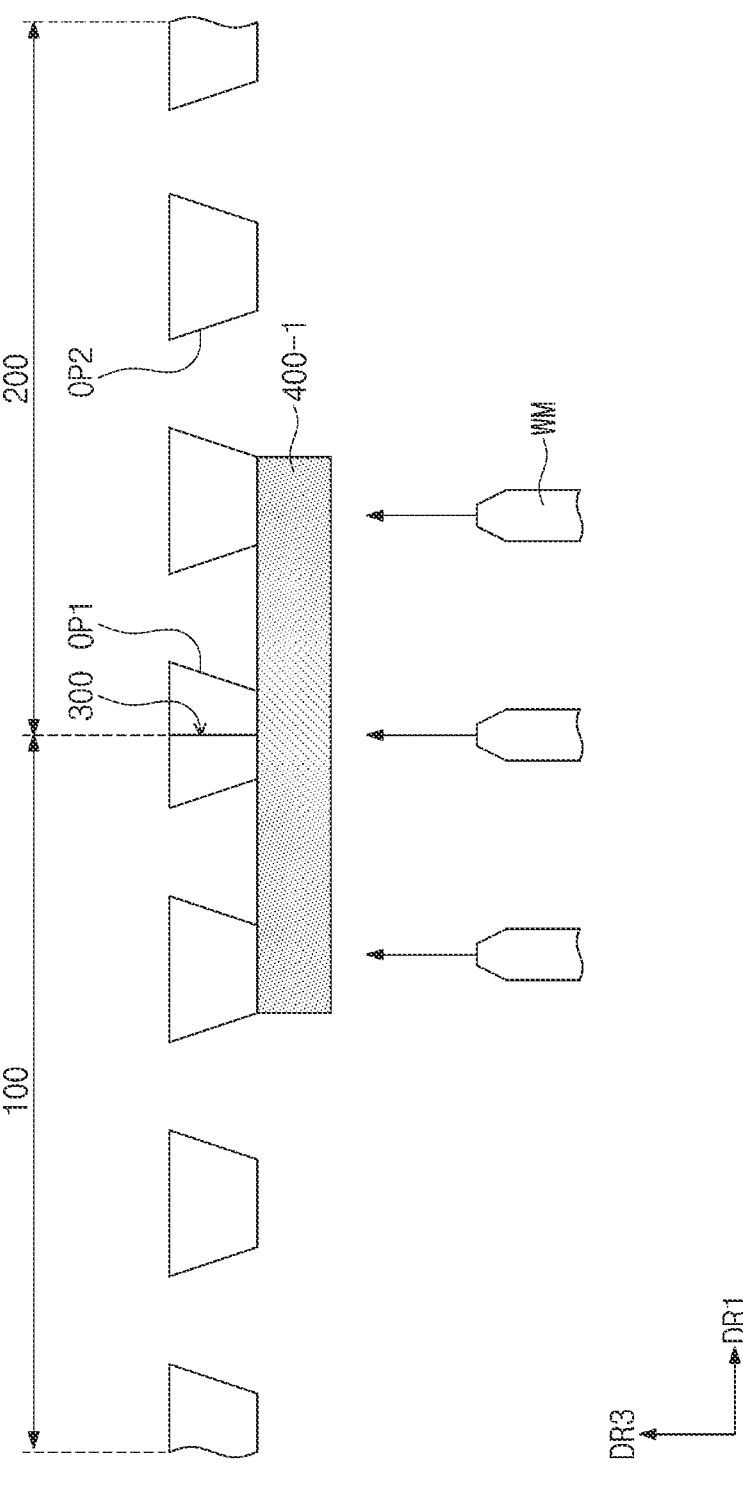
Figure 5C:
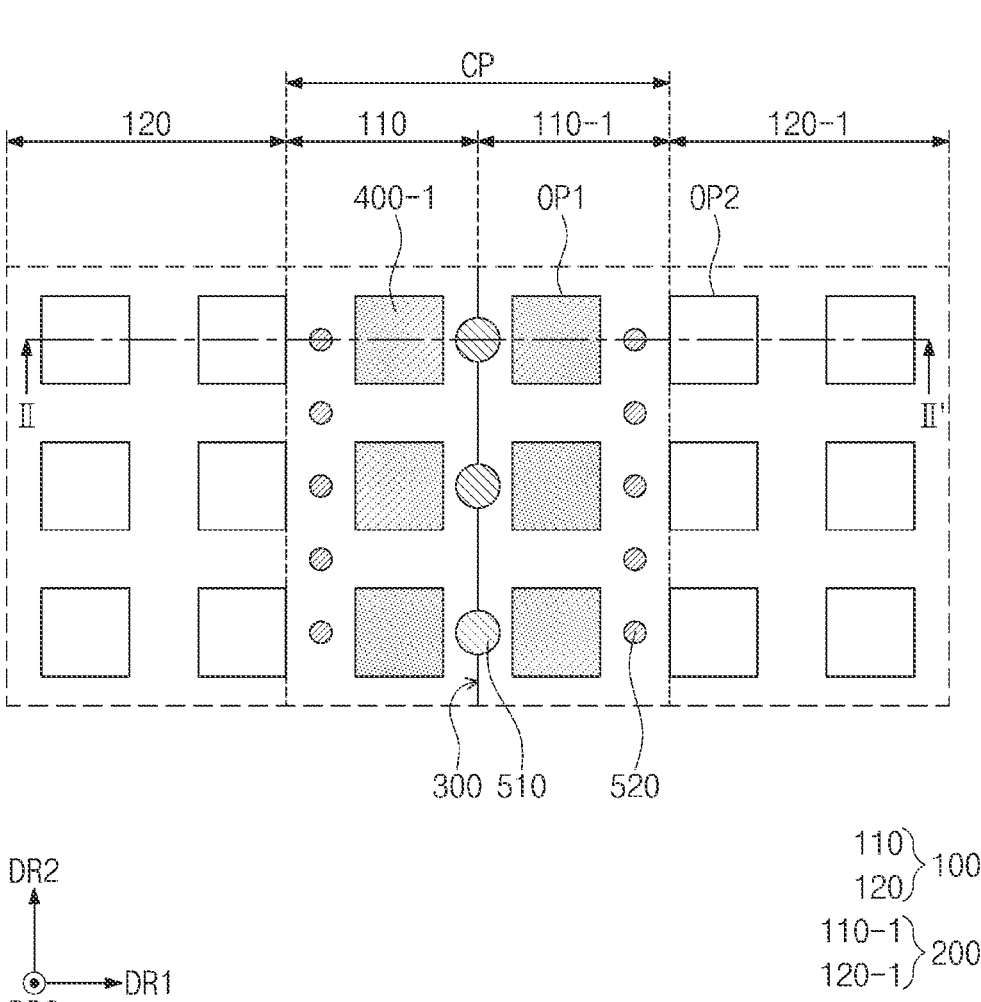

The first connection rods 510 may be disposed not to overlap the first openings OP1 in the first direction DR1, but the first connection rods 510 may be disposed between two first openings OP1 adjacent to each other to overlap the first openings OP in the first direction DR1 (refer to FIG. 5C). The first connection rods 510 may have a relatively large diameter and may be disposed to penetrate through the boundary portion 300. Thus, the first sub-mask 100 and the second sub-mask 200 may be prevented from being separated in the boundary portion 300, and the alignment between the first sub-mask 100 and the second sub-mask 200 may be maintained.

According to an embodiment, the distance WT1 between the first openings OP1 adjacent to each other with the boundary portion 300 therebetween in the first direction DR1 may be substantially the same as a distance WT2 between the first openings OP1 and the second openings OP2 in the first direction DR1. Accordingly, the mask MS obtained by connecting the first sub-mask 100 and the second sub-mask 200 may be used as a mask.

FIG. 4, a width DL1 of the first opening OP1 may be smaller than a width DL2 of the third opening OP3. The width DL2 of the third opening OP3 may be larger than the width DL1 of the first opening OP1 by a first length LD in each of the first direction DR1 and a direction opposite to the first direction DR1. The first length LD may be equal to or greater than about 1 μm. For example, the width DL2 of the third opening OP3 may be larger than the width DL1 of the first opening OP1 by about 2 μm. As the width DL2 of the third opening OP3 is larger than the width DL1 of the first opening OP1, shadow defects caused by a deposition angle in the deposition process may be prevented from occurring.

In a cross-sectional view, the first opening OP1, the second opening OP2, and the third opening OP3 may have a tapered shape. The first opening OP1 and the second opening OP2 may have a same tapered shape. The first opening OP1 and the second opening OP2 may have a first taper angle TA1. The third opening OP3 may have a second taper angle TA2.

The first taper angle TA1 may be different from the second taper angle TA2. A difference angle TAD corresponding to a difference in angle between the first taper angle TA1 and the second taper angle TA2 may be equal to or greater than about 1 degree. As an example, the first taper angle TA1 may be greater than the second taper angle TA2 by an angle equal to or greater than about 1 degree and equal to or smaller than about 10 degrees. The second taper angle TA2 of the third opening OP3 may be smaller than the first taper angle TA1 of the first opening OP1 aligned in the third direction DR3, and thus, the shadow defects caused by the deposition angle in the deposition process may be prevented from occurring.

FIGS. 5A to 5F are schematic views of a method of manufacturing the mask MS according to an embodiment of the disclosure. FIG. 6 is a schematic flowchart of the manufacturing method of the mask according to an embodiment of the disclosure.

As illustrated in FIG. 6, the manufacturing method of the mask may include an aligning operation S610, a welding operation S620, and a hole processing operation S630. The welding operation S620 may be referred to as a coupling operation.

FIG. 5A is a view illustrating the aligning operation. A first boundary surface 300-1 of the first sub-mask 100 and a second boundary surface 300-2 of the second sub-mask 200 may approach and may be aligned with each other in the first direction DR1. The first boundary surface 300-1 and the second boundary surface 300-2 may contact each other to form the boundary portion 300 (refer to FIG. 3). In the aligning operation of forming the boundary portion 300, the first sub-mask 100 and the second sub-mask 200 may be aligned with each other in the first direction DR1 and the second direction DR2.

FIGS. 5B and 5C are schematic views illustrating the coupling operation. A preliminary coupling bar 400-1 may be coupled to the lower surfaces of the aligned first sub-mask 100 and the second sub-mask 200. The preliminary coupling bar 400-1 may be welded to the first sub-mask 100 and the second sub-mask 200 by a welding module WM. The preliminary coupling bar 400-1 may be provided in the form of a bar-shaped plate and may be disposed under the connection portion CP. The first connection rods 510 may be formed by welding the boundary portion 300. The second connection rods 520 may be formed by the welding operation and may not overlap the first opening OP1 in the connection portion CP.

In the welding operation, a size of a welding surface welded to the boundary portion 300 may be greater than a size of other welding surfaces that do not overlap the boundary portion 300. For example, the diameter of each of the first connection rods 510 may be greater than the diameter of the second connection rods 520.

FIGS. 5B and 5C illustrate a state in which the first opening OP1 is blocked by the coupling of the preliminary coupling bar 400-1.

Figure 5D:
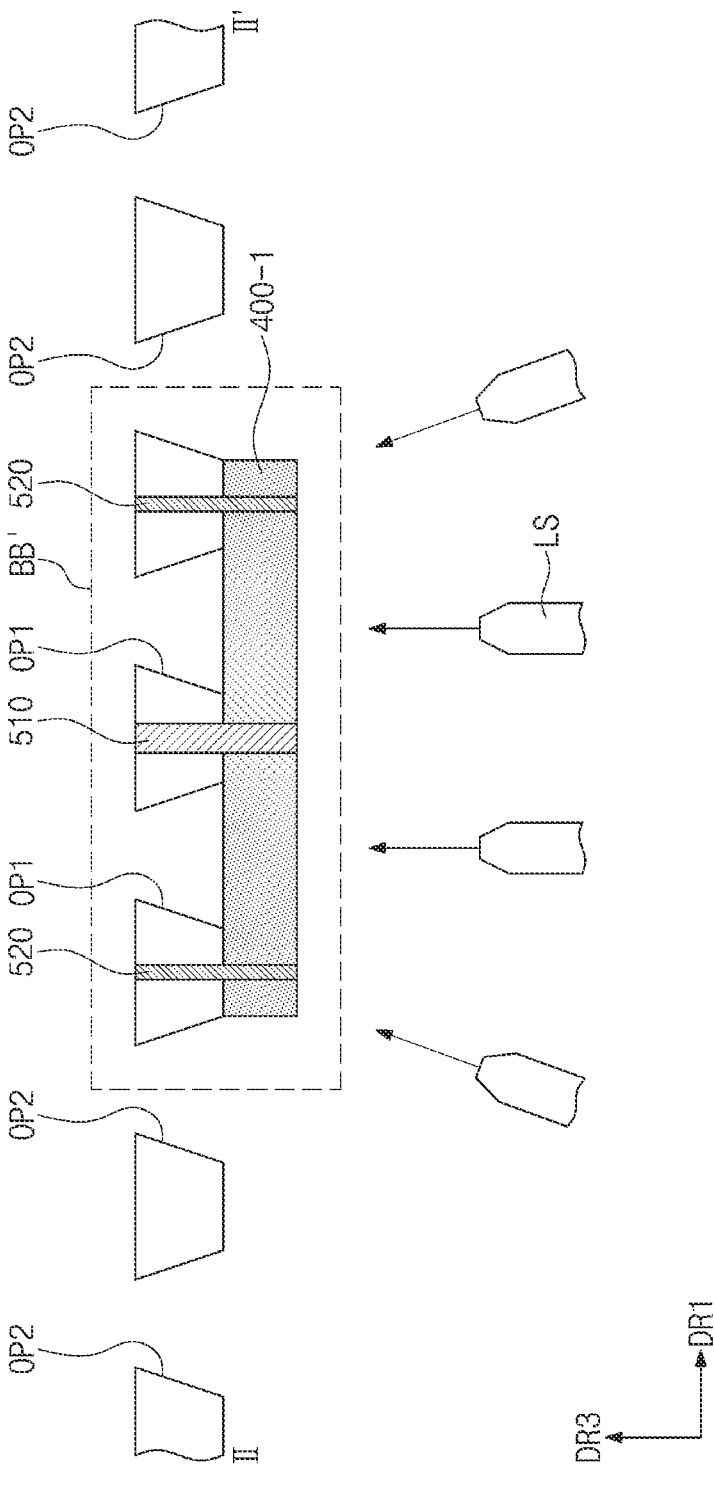
Figure 5E:
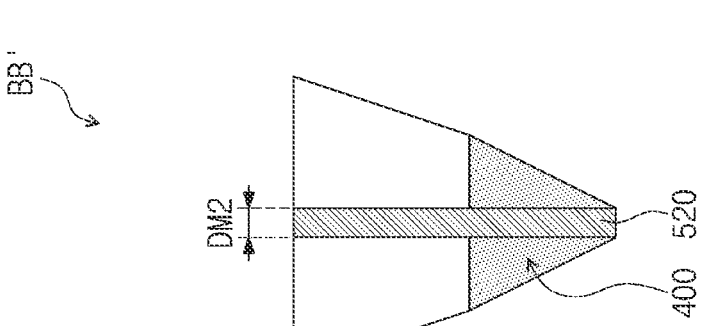
Figure 5E:
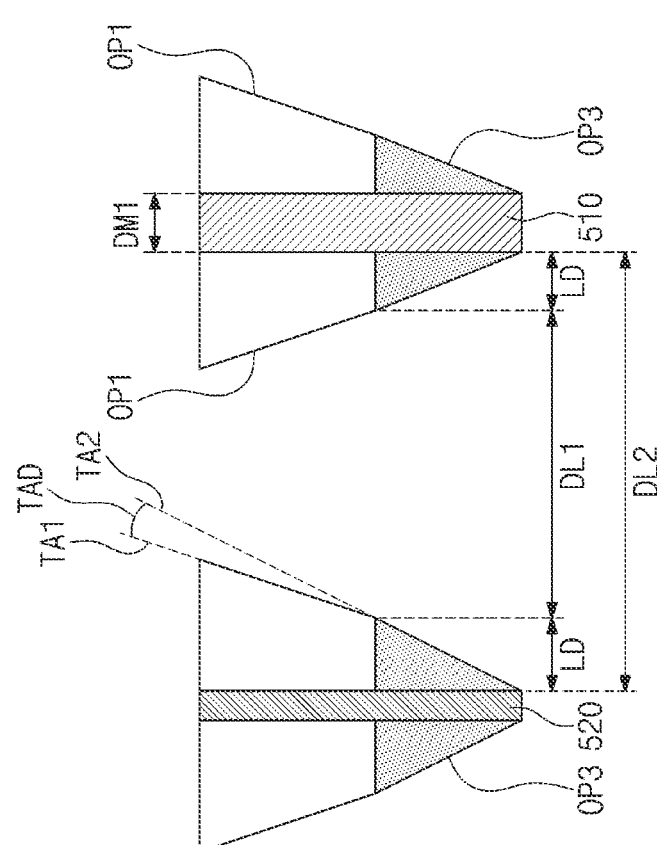
Figure 5F:
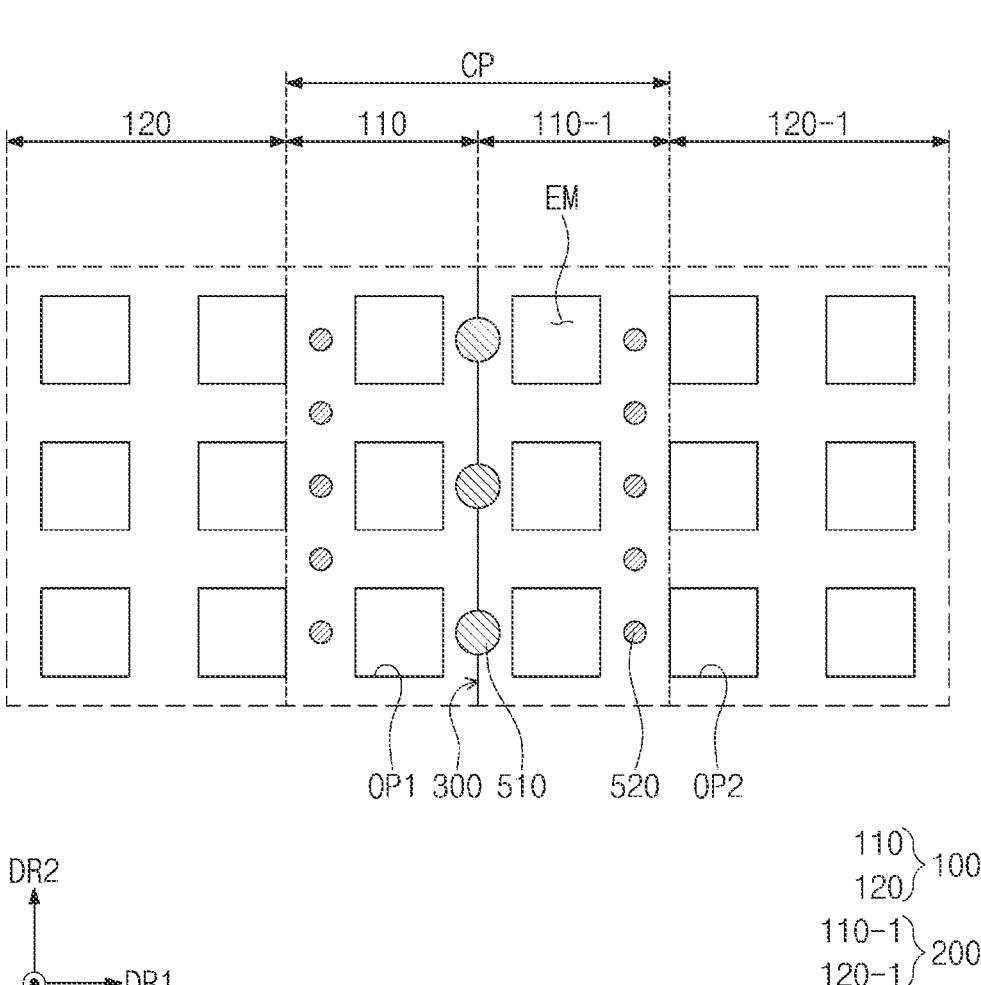
Figure 6:
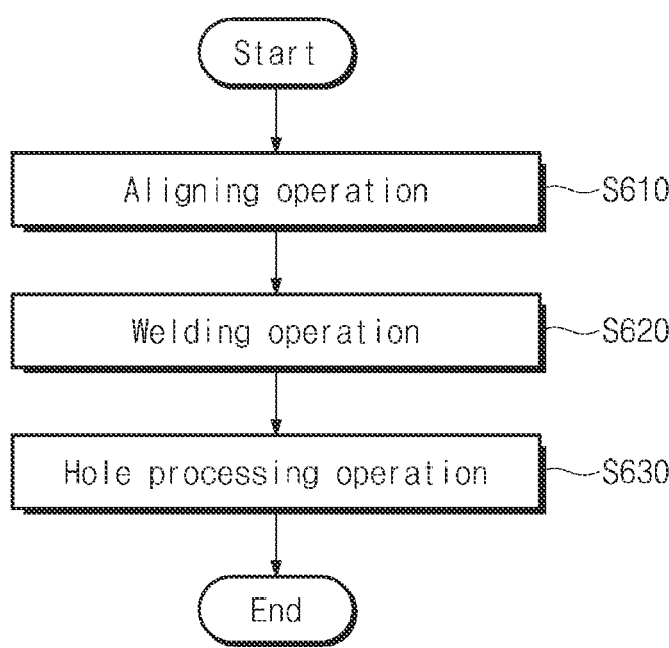
FIG. 6 is a schematical flowchart of a method of manufacturing a mask according to an embodiment of the disclosure.

FIGS. 5D to 5F illustrate the hole processing operation.

FIG. 5D is a schematic view illustrating an operation of irradiating a laser LS onto a cross-section taken along line II-II' of FIG. 5C. FIG. 5D illustrates the operation of irradiating the laser LS onto the lower surface of the preliminary coupling bar 400-1 to form the third opening OP3 aligned with the first opening OP1. The laser LS may be irradiated to a portion of the preliminary coupling bar 400-1 that blocks the first opening OP1.

FIG. 5E is a schematic cross-sectional view illustrating an operation of forming the coupling bar 400 in which the third opening OP3 is defined. FIG. 5E illustrates the coupling bar 400 after the irradiation of the laser LS shown in FIG. 5D. FIG. 5E is a schematic enlarged view illustrating area BB' of FIG. 5D. As illustrated in FIG. 5E, the third openings OP3 may be formed to have the tapered shape. The second taper angle TA2 of the third openings OP3 may be smaller than the first taper angle TA1 of the first openings OP1 by the difference angle TAD. Since the details thereof are described above, descriptions thereof are not repeated herein.

FIG. 5F illustrates a structure in which the third opening OP3 is formed in the coupling bar 400 by the hole processing operation and the first opening OP1 is provided in a plan view. Accordingly, an open area EM may be defined in the first opening OP1 as in the second opening OP2.

Figure 7A:
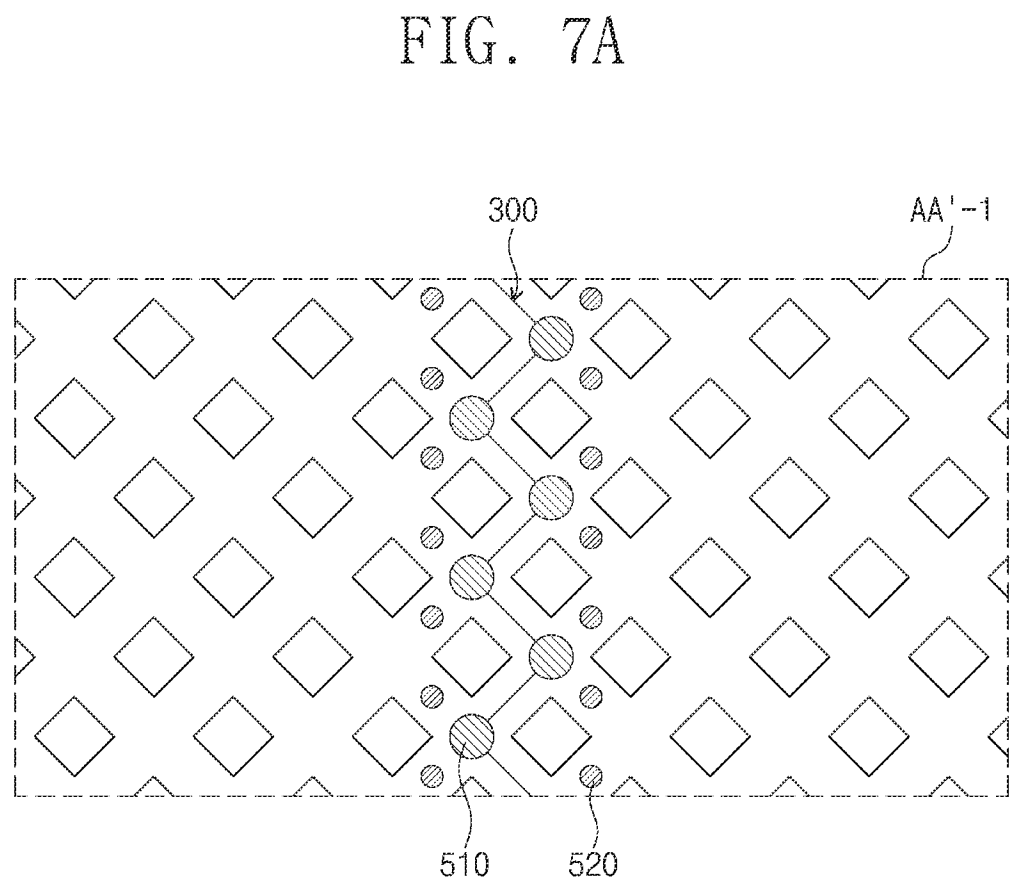
Figure 7B:
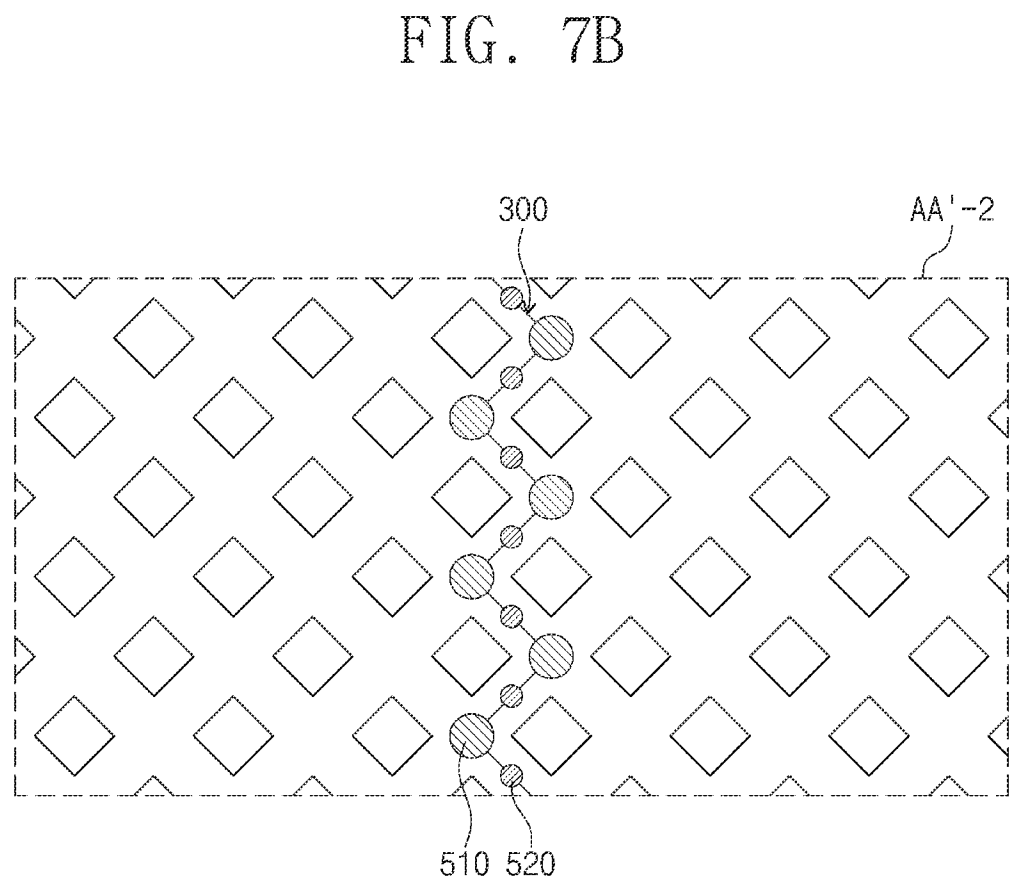

FIGS. 7A and 7B are schematic enlarged plan views of a mask according to embodiments of the disclosure.

FIGS. 7A and 7B illustrate area AA'-1 and area AA'-2 corresponding to area AA' of FIG. 2A according to embodiments of the disclosure.

Referring to FIGS. 7A and 7B, a boundary portion 300 may have a zigzag shape rather than having a straight line shape. As an example, the boundary portion 300 may include a boundary line having the zigzag shape. In this case, a boundary surface of each of a first sub-mask 100 (refer to FIG. 2A) and a second sub-mask 200 (refer to FIG. 2A) may have a step difference in the second direction DR2 (refer to FIG. 2A).

Welding positions in FIG. 7A are different from welding positions in FIG. 7B. As illustrated in FIGS. 7A and 7B, first connection rods 510 may be disposed at vertices of the boundary line. As illustrated in FIG. 7A, second connection rods 520 may not be disposed on the boundary line. As illustrated in FIG. 7B, the second connection rods 520 may be disposed on the boundary line. The second connection rods 520 may be disposed between the first connection rods 510 on the boundary line. In this case, the second connection rods 520 may have a diameter smaller than a diameter of the first connection rods 510.

The boundary portion 300 may be designed in a variety of shapes. As an example, the shape of the boundary portion 300 may be designed based on a shape of openings OP. FIGS. 7A and 7B illustrate a structure in which each of the openings OP has a lozenge shape and the boundary portion 300 has the zigzag shape as a representative example.

Figure 8A:
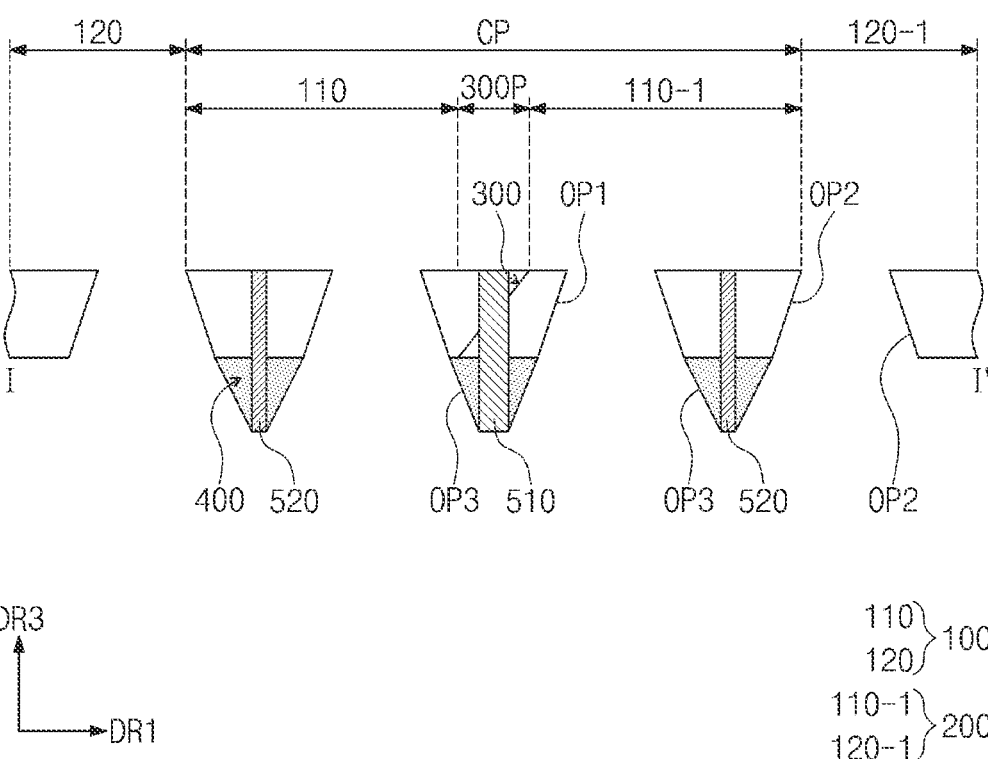
FIGS. 8A and 8B are schematical cross-sectional views of a mask according to embodiments of the disclosure.
Figure 8B:
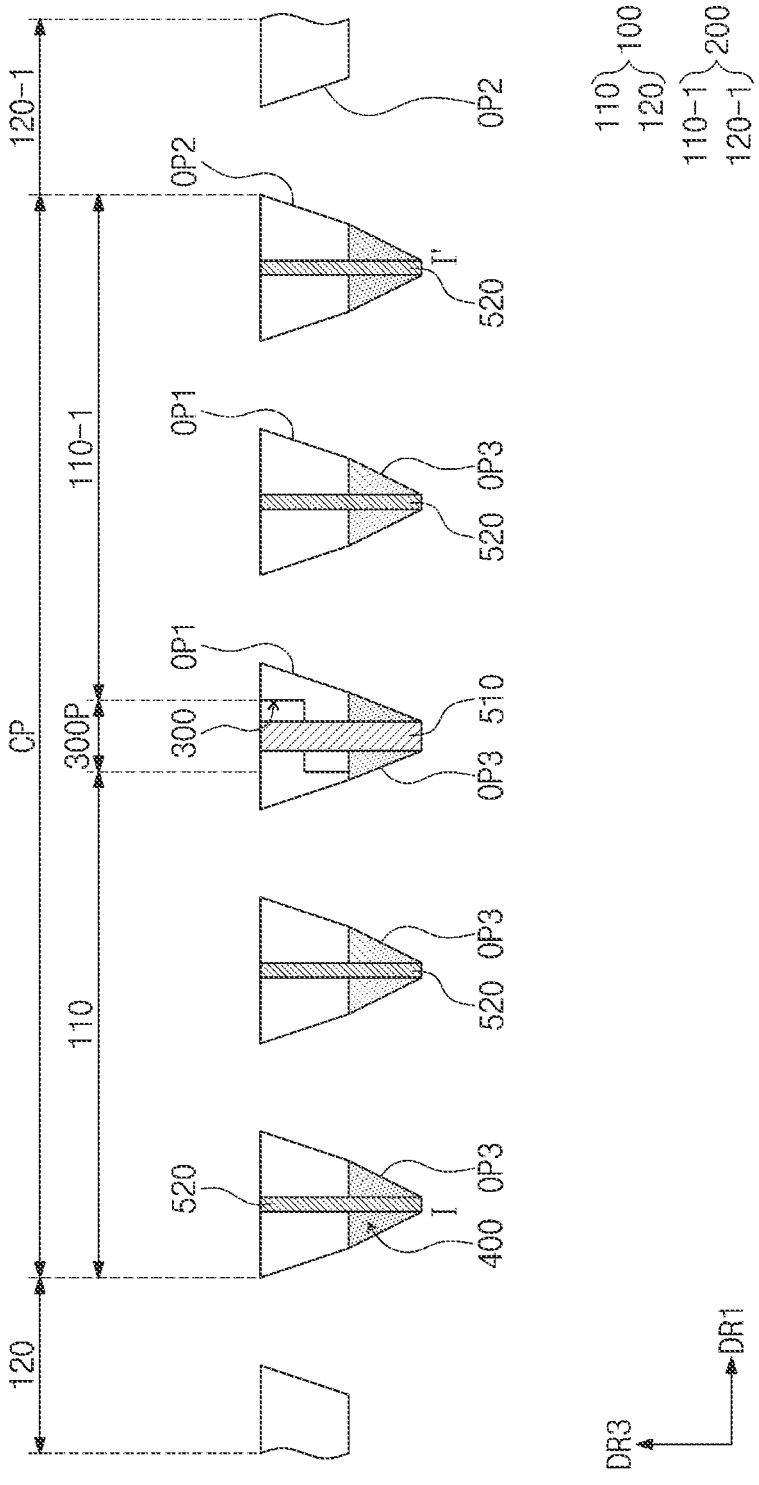

FIGS. 8A and 8B are schematic cross-sectional views of a mask according to embodiments of the disclosure. FIGS. 8A and 8B illustrate cross-sections taken along line I-I' of FIG. 3 according to embodiments of the disclosure.

Referring to FIG. 8A, a boundary portion 300 may have an oblique shape in a cross-sectional view. For example, a first sub-mask 100 and a second sub-mask 200 may include a boundary surface having the oblique shape. In the embodiment, a boundary area 300P may be defined by the boundary portion 300 having the oblique shape. As the boundary area 300P increases, an alignment consistency between the first sub-mask 100 and the second sub-mask 200 may increase.

As the boundary surface of each of the first sub-mask 100 and the second sub-mask 200 may have the oblique shape, a contact area between the first sub-mask 100 and the second sub-mask 200 may be relatively large. Accordingly, the alignment consistency between the first sub-mask 100 and the second sub-mask 200 may increase.

Referring to FIG. 8B, a boundary portion 300 may have a step difference in a cross-sectional view. In case that the boundary portion 300 has the step difference, a boundary surface of a first sub-mask 100 and a boundary surface of a second sub-mask 200 may also have a step difference (or height difference). As an example, the boundary surface of the first sub-mask 100 may have an L shape rotated in a clockwise direction, and the boundary surface of the second sub-mask 200 may have an L shape. The boundary portion 300 may be defined in a boundary area 300P. The boundary area 300P may be defined between a first portion 110 of the first sub-mask 100 and a first portion 110-1 of the second sub-mask 200.

In the embodiment, a contact area between a first boundary surface 300-1 (refer to FIG. 5A) of the first sub-mask 100 and a second boundary surface 300-2 (refer to FIG. 5A) of the second sub-mask 200 that contact each other in the boundary portion may be relatively large. Accordingly, the alignment consistency between the first sub-mask 100 and the second sub-mask 200 may increase.

According to an embodiment, a width in the first direction DR1 of a coupling bar 400 should not be limited to that shown in the drawings. As an example, the width in the first direction DR1 of the coupling bar 400 in FIG. 8B may be greater than the width in the first direction DR1 of the coupling bar 400 in FIG. 8A. As illustrated in FIGS. 4 and 8A, the coupling bar 400 may be provided with two third openings OP3 defined therein and arranged in the first direction DR1. As illustrated in FIG. 8B, the coupling bar 400 may be provided with four third openings OP3 defined therein and arranged in the first direction DR1.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A mask comprising:

a first sub-mask comprising a first boundary surface;

a second sub-mask facing the first sub-mask in a first direction and comprising a second boundary surface, the second boundary surface contacting the first boundary surface of the first sub-mask;

a coupling bar disposed on a lower surface of the first sub-mask and a lower surface of the second sub-mask to connect the first sub-mask to the second sub-mask, and a connection rod that connects the first sub-mask and the second sub-mask to the coupling bar, the connection rod penetrating through an interface between the first boundary surface and the second boundary surface and the connection rod extending along a thickness direction of the coupling bar, wherein the first sub-mask comprises a first opening, the second sub-mask comprises a second opening, and the coupling bar comprises a plurality of third openings, wherein at least one opening of the plurality of third openings of the coupling bar is aligned with the first opening of the first sub-mask in the thickness direction of the coupling bar and at least one opening of the plurality of third openings of the coupling bar is aligned with the second opening of the second sub-masks in the thickness direction of the coupling bar.

2. The mask of claim 1, wherein each of the first sub-mask and the second sub-mask comprise:

a first portion; and a second portion that extends from the first portions, the first portion of the first sub-mask and the first portion of the second sub-mask being in between the second portion of the first sub-mask and the second portion of the second sub-mask, and the first boundary surface being on the first portion of the first sub-mask and the second boundary surface being on the first portion of the second sub-mask.

3. The mask of claim 2, wherein the first opening is in the first portion of the first sub-mask and the second opening is in the first portion of the second sub-mask such that the interface between the first boundary surface and the second boundary surface is in between the first opening and the second opening, and a first distance between the first opening and the second opening in the first direction is substantially equal to a second distance between additional openings adjacent to each other in the first direction and disposed in the second portion of at least one of the first sub-mask and the second sub-mask.

4. The mask of claim 2, wherein the first portion of the first sub-mask and the first portion of the second sub-mask define a connection portion, and the coupling bar overlaps the connection portion in a plan view.

5. The mask of claim 4, wherein the first opening is one of a plurality of first openings formed through the first portion; and the plurality of first openings including a peripheral opening formed through the second portion.

6. The mask of claim 5, wherein the connection rods is a first connection rod and the mask further comprises a second connection rod, each of the first connection rod and the second connection rod being disposed between a pair of openings of the plurality of first openings in the connection portion, between a pair of openings of the plurality second openings in the connection portion, or between a single opening of the plurality of first openings and a single opening of the plurality second openings in the connection portion.

7. The mask of claim 6, wherein the first connection rod has a diameter different from a diameter of the second connection rod.

8. The mask of claim 6, wherein a diameter of the first connection rod is greater than a diameter of the second connection rod and the diameter of the first connection rod is smaller than a distance between adjacent openings of the plurality of first openings or a distance between adjacent openings of the plurality of second openings.

9. The mask of claim 1, wherein the at least one opening of the plurality of third openings that is aligned with the first opening has a width greater than a width of the first opening.

10. The mask of claim 1, wherein each of the first opening and the at least one opening of the plurality of third openings that is aligned with the first opening has a tapered shape in a cross-section, and a difference in angulation between a taper angle of the first opening and a taper angle of the at least one opening of the plurality of third openings that is aligned with the first opening is equal to or greater than about 1 degree and equal to or smaller than about 10 degrees.

11. The mask of claim 1, wherein each of the first sub-mask and the second sub-mask further comprises pads disposed on side surfaces of the first sub-mask and the second sub-mask, the side surfaces not including the first boundary surface and the second boundary surface.

12. The mask of claim 1, wherein the interface between the first boundary surface and the second boundary surface extends in a second direction intersecting the first direction and has a straight line shape or a zigzag shape in a plan view.

13. The mask of claim 1, wherein the first boundary surface and the second boundary surface have an oblique shape or a step difference.

14. A mask assembly comprising:

a first frame;

a second frame disposed on the first frame and comprising cell openings; and a plurality of masks respectively disposed on the cell openings, each mask of the plurality of masks comprising:

a first sub-mask comprising a first boundary surface;

a second sub-mask comprising a second boundary surface contacting the first boundary surface of the first sub-mask; and a coupling bar disposed on a lower surface of the first sub-mask and a lower surface of the second sub-mask to connect the first sub-mask to the second sub-mask; and a connection rod that connects the first sub-mask and the second sub-mask to the coupling bar, the connection rod penetrating through an interface between the first boundary surface and the second boundary surface and the connection rod extending along a thickness direction of the coupling bar, wherein the first sub-mask comprises a first opening, the second sub-mask comprises a second opening, and the coupling bar comprises a plurality of third openings, wherein at least one opening of the plurality of third openings of the coupling bar is aligned with the first openings of the first sub-mask in the thickness direction of the coupling bar and at least one opening of the plurality of third openings of the coupling bar is aligned with the second opening of the second sub-masks in the thickness direction of the coupling bar and the connection rod contacts an inner surface of each of the first sub-mask, the second sub-mask, and the coupling bar.

\* \* \* \* \*